United States Patent
Zhang et al.

(10) Patent No.: US 11,676,994 B2
(45) Date of Patent: *Jun. 13, 2023

(54) MANUFACTURING METHOD OF SEMICONDUCTOR DEVICE AND SEMICONDUCTOR DEVICE

(71) Applicant: Fujian Jinhua Integrated Circuit Co., Ltd., Quanzhou (CN)

(72) Inventors: Janbo Zhang, Quanzhou (CN); Li-Wei Feng, Quanzhou (CN); Yu-Cheng Tung, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/827,777

(22) Filed: May 29, 2022

(65) Prior Publication Data

US 2022/0293721 A1    Sep. 15, 2022

Related U.S. Application Data

(63) Continuation of application No. 17/240,998, filed on Apr. 26, 2021, now Pat. No. 11,380,754.

(30) Foreign Application Priority Data

Aug. 20, 2020   (CN) .......................... 202010842754.7

(51) Int. Cl.
*H01L 21/762*   (2006.01)
*H01L 27/06*   (2006.01)
(Continued)

(52) U.S. Cl.
CPC ........ *H01L 28/75* (2013.01); *H01L 21/76224* (2013.01); *H01L 27/0629* (2013.01);
(Continued)

(58) Field of Classification Search
CPC .............. H01L 28/75; H01L 28/90–92; H01L 21/76224; H01L 29/0607; H01L 27/0629;
(Continued)

(56) References Cited

U.S. PATENT DOCUMENTS

11,380,754 B2 * 7/2022 Zhang ..................... H01L 28/75
2013/0009273 A1   1/2013 Kim
(Continued)

*Primary Examiner* — Jose R Diaz
(74) *Attorney, Agent, or Firm* — Winston Hsu (57) ABSTRACT

The present invention provides a manufacturing method of a semiconductor device and a semiconductor device. A semiconductor device is provided, the semiconductor device includes a substrate, a stacked structure disposed on the substrate, the substrate comprises a cell array region, a peripheral circuit region and a middle region between the cell array region and the peripheral circuit region, the stacked structure comprises a first support layer, a first trench located in the middle region, a second support layer located on an upper surface of the stacked structure, wherein parts of the second support layer is disposed in the first trench, a portion of a sidewall of the first support layer directly contacts a portion of a sidewall of the second support layer, and a capacitor structure located in the cell array region.

18 Claims, 10 Drawing Sheets

(51) Int. Cl.
  *H01L 29/06* (2006.01)
  *H10B 12/00* (2023.01)
  *H01L 49/02* (2006.01)

(52) U.S. Cl.
  CPC ............ *H01L 28/90* (2013.01); *H01L 28/91* (2013.01); *H01L 28/92* (2013.01); *H01L 29/0607* (2013.01); *H10B 12/033* (2023.02); *H10B 12/09* (2023.02)

(58) Field of Classification Search
  CPC ......... H01L 27/10852; H01L 27/10894; H01L 21/822; H01L 27/06; H01L 21/76227; H10B 12/09; H10B 12/033
  See application file for complete search history.

(56) References Cited

U.S. PATENT DOCUMENTS

2013/0270677 A1   10/2013  Tomoyama
2018/0277546 A1*  9/2018  Wang ................ H01L 27/10814

* cited by examiner

MANUFACTURING METHOD OF SEMICONDUCTOR DEVICE AND SEMICONDUCTOR DEVICE

CROSS REFERENCE TO RELATED APPLICATIONS

This application is a continuation application of U.S. application Ser. No. 17/240,998, filed on Apr. 26, 2021. The content of the application is incorporated herein by reference.

BACKGROUND OF THE INVENTION

1. Field of the Invention

The invention relate to that field of semiconductors, in particular to a manufacturing method of a semiconductor device and a semiconductor device.

2. Description of the Prior Art

In the prior art, in order to increase the integration of the semiconductor device, the area occupied by each component in the semiconductor device is reduced. In order not to affect the capacity of the capacitor, it is usually chosen to increase the effective area of the lower electrode in the capacitor structure. For example, a three-dimensional lower electrode can be manufactured, which can be formed with a cylindrical structure, and the sidewall of the lower electrode of the cylindrical structure extends in the direction perpendicular to the surface of the substrate, so as to increase the height of the lower electrode and expand the effective area, thus ensuring that the capacitor required by the semiconductor device can be achieved.

However, increasing the height of the lower electrodes may cause the lower electrodes to collapse. This problem can be solved by arranging support structures between the lower electrodes. However, the existence of support structures will also introduce new problems. The support structures will exert stress on the lower electrodes, which will cause distortion of the lower electrodes, and may also cause electrical connections between different circuit areas, resulting in current leakage, thus affecting the performance of semiconductor devices.

SUMMARY OF THE INVENTION

The technical problem to be solved by the invention is how to improve the stability of the lower electrode so as to reduce the electrical connection between different circuit areas and improve the performance of semiconductor devices.

To solve the above technical problems, the present invention provides a semiconductor device manufacturing method and a semiconductor device.

In some embodiments of the present invention, a semiconductor device is provided, the semiconductor device includes a substrate, a stacked structure disposed on the substrate, the substrate comprises a cell array region, a peripheral circuit region and a middle region between the cell array region and the peripheral circuit region, wherein the stacked structure comprises a first support layer, a first trench located in the middle region, a second support layer located on an upper surface of the stacked structure, wherein parts of the second support layer is disposed in the first trench, wherein a portion of a sidewall of the first support layer directly contacts a portion of a sidewall of the second support layer, and a capacitor structure located in the cell array region.

In some embodiments of the present invention, a second trench structure is disposed between the first trench structure and the peripheral circuit region.

In some embodiments of the present invention, part of the second support layer is disposed in the first trench to form first guard ring structure in the middle region.

In some embodiments of the present invention, parts of the second support layer is disposed in the second trench to form second guard ring structure in the middle region, wherein the second guard ring structure surrounds the first guard ring structure.

In some embodiments of the present invention, the semiconductor device further comprises an ONONO structure located on the substrate of the peripheral circuit region, and the ONONO structure comprises a first dielectric layer, the first support layer, a second dielectric layer, the second support layer and an oxide layer.

In some embodiments of the present invention, the capacitor structure comprises a lower electrode, a capacitor dielectric layer and an upper electrode.

In some embodiments of the present invention, both the first support layer and the second support layer contact the capacitor structure directly.

In some embodiments of the present invention, part of the second support layer disposed in the first trench directly contacts the capacitor structure.

In some embodiments of the present invention, the second support layer disposed on the upper surface of the stacked structure and the second support layer disposed in the first trench are an integrally formed structure.

In some embodiments of the present invention, the second support layer disposed in the cell array region, in the peripheral circuit region and in the middle region.

In some embodiments of the present invention, a method of forming a semiconductor device is provided, the method includes forming a substrate, forming a stacked structure on the substrate, wherein the substrate comprises a cell array region, a peripheral circuit region and an middle region between the cell array region and the peripheral circuit region, the stacked structure comprises a first support layer, forming a first trench in the middle region, forming a second support layer located on an upper surface of the stacked structure, wherein parts of the second support layer is disposed in the first trench, wherein a portion of a sidewall of the first support layer directly contacts a portion of a sidewall of the second support layer, and forming a capacitor structure in the cell array region.

In some embodiments of the present invention, a second trench structure is further formed between the first trench structure and the peripheral circuit region.

In some embodiments of the present invention, part of the second support layer is disposed in the first trench to form first guard ring structure in the middle region.

In some embodiments of the present invention, parts of the second support layer is disposed in the second trench to form second guard ring structure in the middle region, wherein the second guard ring structure surrounds the first guard ring structure.

In some embodiments of the present invention, the semiconductor device further comprises an ONONO structure located on the substrate of the peripheral circuit region, and the ONONO structure comprises a first dielectric layer, a first support layer, a second dielectric layer, the second support layer and an oxide layer.

In some embodiments of the present invention, the capacitor structure comprises a lower electrode, a capacitor dielectric layer and an upper electrode.

In some embodiments of the present invention, both the first support layer and the second support layer contact the capacitor structure directly.

In some embodiments of the present invention, part of the second support layer disposed in the first trench directly contacts the capacitor structure.

In some embodiments of the present invention, the second support layer disposed on the upper surface of the stacked structure and the second support layer disposed in the first trench are an integrally formed structure.

In some embodiments of the present invention, the second support layer disposed in the cell array region, in the peripheral circuit region and in the middle region simultaneously.

According to the semiconductor device manufacturing method and the semiconductor device, a stacked structure is formed on a substrate, wherein the stacked structure comprises a first dielectric layer, a first support layer and a second dielectric layer which are sequentially formed on the substrate, and the substrate comprises a cell array region, a peripheral circuit region and a middle region between the cell array region and the peripheral circuit region; Forming a guard ring trench around the periphery of the cell array region in the middle region; depositing a first insulating material on the upper surface of the second dielectric layer to form a second supporting layer, and depositing a second insulating material on the bottom surface and sidewalls of the guard ring trench to form a guard ring structure. A capacitor structure is formed in the cell array region. In this method, the guard ring structure is formed in the middle region between the cell array region and the peripheral circuit region, which can avoid etching the peripheral circuit region when the capacitor structure is formed in the cell array region, and to protect the device performance of the peripheral circuit region. In addition, it can also support the electrode structure of the cell array region, avoid the dumping of the lower electrode, improve the stability of the structure, and at the same time, it can physically isolate the cell array region from the peripheral circuit region to avoid current leakage, thus greatly improving the performance of semiconductor devices.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The scope of the present disclosure can be better understood by reading the following detailed description of exemplary embodiments in conjunction with the accompanying drawings. The enclosed drawings are.

DETAILED DESCRIPTION

In order to make the purpose, technical scheme and advantages of the present invention clearer, the implementation method of the present invention will be described in detail with reference to the drawings and embodiments, so as to fully understand and implement the implementation process of how to apply technical means to solve technical problems and achieve technical effects.

In the prior art, in order to increase the integration of the semiconductor device, the area occupied by each component in the semiconductor device is reduced. In order not to affect the capacity of the capacitor, it is usually chosen to increase the effective area of the lower electrode in the capacitor structure. For example, a three-dimensional lower electrode can be manufactured, which can be formed with a cylindrical structure, and the sidewall of the lower electrode of the cylindrical structure extends in the direction perpendicular to the surface of the substrate, so as to increase the height of the lower electrode and expand the effective area, thus ensuring that the capacitor required by the semiconductor device can be achieved.

However, increasing the height of the lower electrodes may cause the lower electrodes to collapse. This problem can be solved by setting support structures between the lower electrodes. However, the existence of support structures will also introduce new problems. The support structures will exert stress on the lower electrodes and cause the lower electrodes to twist, and may also cause electrical connections between different circuit areas, resulting in current leakage, thus affecting the performance of semiconductor devices.

In view of this, the present invention provides a semiconductor device manufacturing method and a semiconductor device, a stacked structure is formed on a substrate, the stacked structure comprises a first dielectric layer, a first support layer and a second dielectric layer which are sequentially formed on the substrate, and the substrate comprises a cell array region, a peripheral circuit region and a middle region between the cell array region and the peripheral circuit region. A guard ring trench is formed around the periphery of the cell array region in the middle region. A first insulating material is deposited on the upper surface of the second dielectric layer to form a second supporting layer, and a second insulating material is deposited on the bottom surface and sidewalls of the guard ring trench to form a guard ring structure. A capacitor structure is formed in the cell array region. In this method, the guard ring structure is formed in the middle region between the cell array region and the peripheral circuit region, which can avoid etching the peripheral circuit region when the capacitor structure is formed in the cell array region, and to protecting the device performance of the peripheral circuit region. In addition, it can also support the electrode structure of the cell array region, avoid the dumping of the lower electrode, improve the stability of the structure, and at the same time, it can physically isolate the cell array region from the peripheral circuit region to avoid current leakage, thus greatly improving the performance of semiconductor devices.

Example 1

Figure 1:
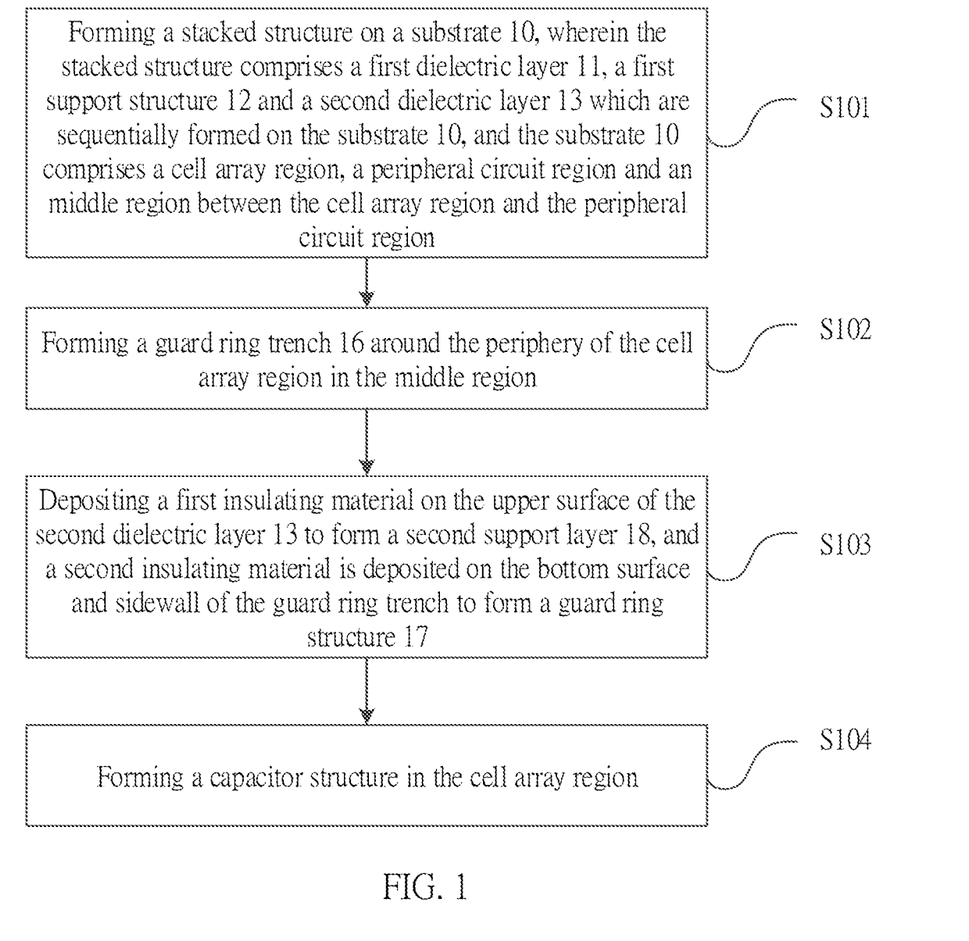
FIG. 1 shows a schematic flow chart of a semiconductor device manufacturing method provided by an embodiment of the present invention.

Referring to FIG. 1, FIG. 1 shows a schematic flow chart of a semiconductor device manufacturing method provided by an embodiment of the present invention, which includes the following steps:

S101: Forming a stacked structure on a substrate 10, wherein the stacked structure comprises a first dielectric layer 11, a first support layer 12 and a second dielectric layer 13 which are sequentially formed on the substrate 10, and the substrate 10 comprises a cell array region, a peripheral circuit region and an middle region between the cell array region and the peripheral circuit region.

S102: Forming a guard ring trench 16 around the periphery of the cell array region in the middle region.

S103: Depositing a first insulating material on the upper surface of the second dielectric layer 13 to form a second support layer 18, and a second insulating material is deposited on the bottom surface and sidewall of the guard ring trench to form a guard ring structure 17.

S104: Forming a capacitor structure in the cell array region.

Figure 2:
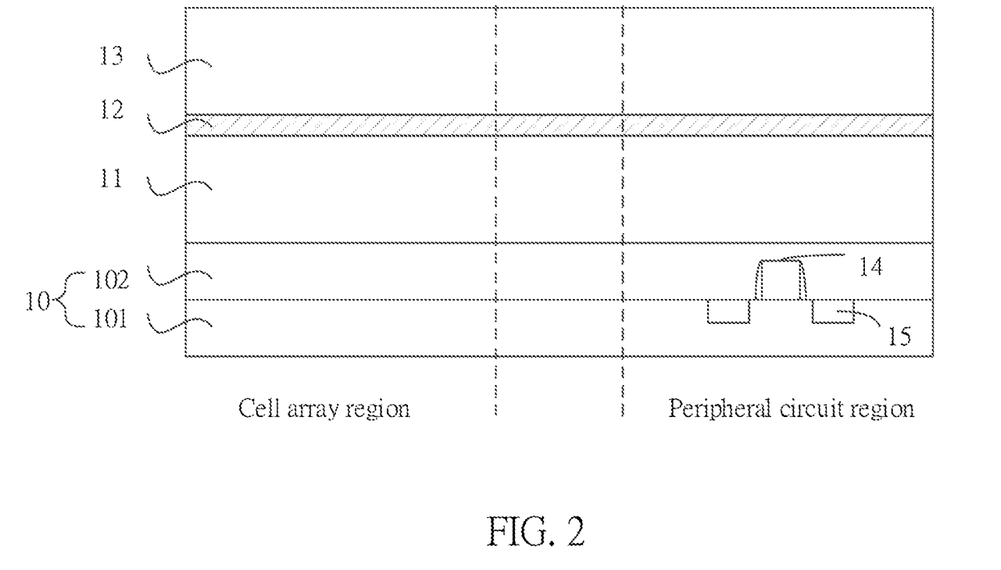
FIG. 2 shows a schematic cross-sectional structure of a stacked structure formed on a substrate provided by an embodiment of the present invention.

Referring to FIG. 2, FIG. 2 shows a schematic cross-sectional structure of a stacked structure formed on a substrate 10 provided by an embodiment of the present invention. In an embodiment of the present invention, step S101 may specifically be to deposit the first dielectric layer 11, the first support layer 12 and the second dielectric layer 13 on the substrate in sequence by chemical vapor deposition or physical vapor deposition.

As an example, the substrate 10 may include a semiconductor substrate 101 and an interlayer insulating layer 102 located on the semiconductor substrate 101. As an example, the semiconductor substrate 101 may include Si substrate, Ge substrate, SiGe substrate, etc. The interlayer insulating layer 102 may include borophosphosilicate glass, silicon dioxide, silicon nitride, silicon oxynitride, silicon carbide, carbon-containing low dielectric constant, etc. The gate structure 14 of the transistor is provided in the interlayer insulating layer 102 of the peripheral circuit region, and the source/drain regions 15 of the transistor are formed in the semiconductor substrate 101 on both sides of the gate structure 14.

In an embodiment of the present invention, the first dielectric layer 11 or the second dielectric layer 13 may include borophosphosilicate glass (BPSG), phosphosilicate glass (PSG), plasma enhanced-tetraethylorthosilicate (PE-TEOS), high density plasma (HDP)-oxide, etc., and the first dielectric layer 11 and the second dielectric layer 13 may be formed of the same material.

The first support layer 12 may be formed of a material which is different from that of the first dielectric layer 11 and the second dielectric layer 13 and can be selectively etched. As an example, the first support layer 12 may include at least one of silicon carbonitride, silicon carbonitride oxide, silicon oxide, silicon nitride and silicon oxynitride. As another example, the first support layer 12 may also be configured to include a plurality of sub-support layers and insulating dielectric layers between adjacent sub-support layers. The sub-supporting layers may include at least one of silicon carbonitride, silicon oxycarbide, silicon carbonitride oxide, silicon oxide, silicon nitride and silicon oxynitride, and the sub-supporting layers are arranged at intervals in the direction perpendicular to the substrate 10. The insulating dielectric layer may be made of the same material as the first dielectric layer 11 or the second dielectric layer 13. By arranging a plurality of sub-supporting layers at intervals, the stability of the lower electrode can be improved.

Figure 3A:
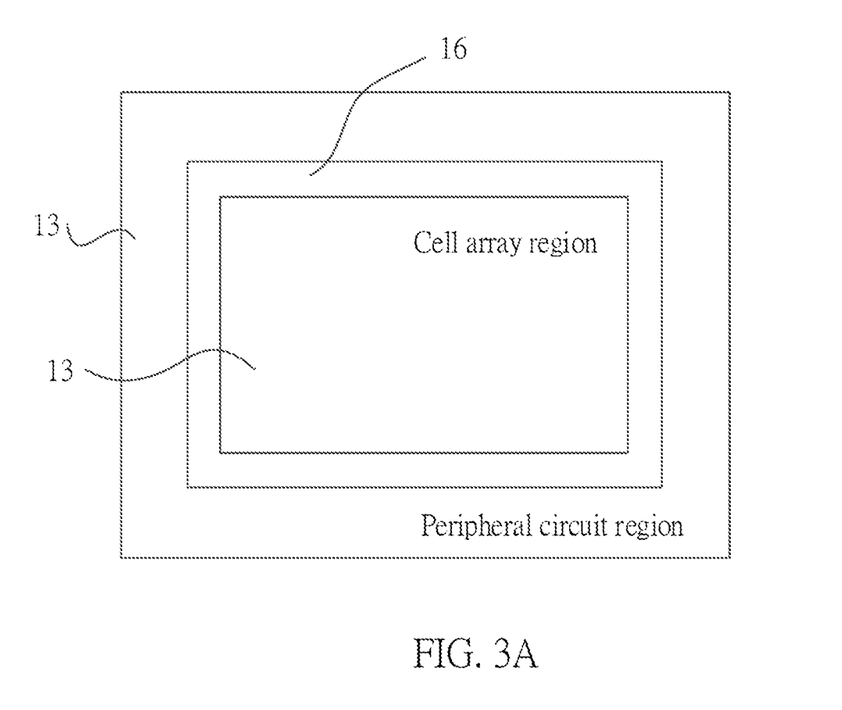
FIG. 3A shows a schematic plan view of forming a guard ring trench around the periphery of the cell array region in the middle region provided by the embodiment of the present invention.
Figure 3B:
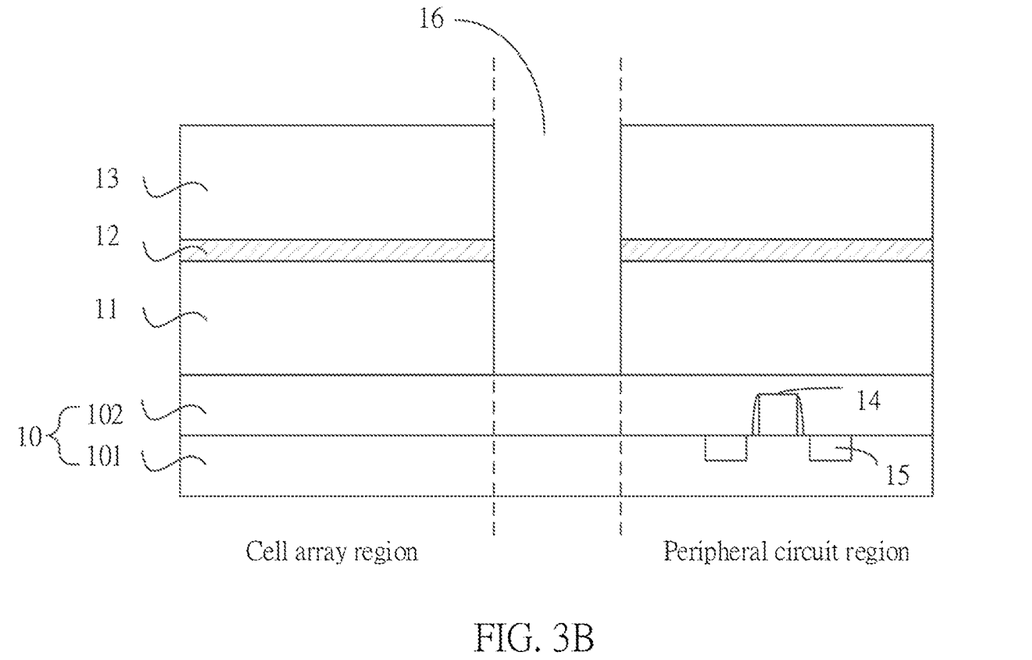
FIG. 3B shows a schematic sectional structure of forming a guard ring trench around the periphery of the cell array region in the middle region provided by the embodiment of the present invention.

Referring to FIG. 3A and FIG. 3B, FIG. 3A shows a schematic plan view of forming a guard ring trench 16 around the periphery of the cell array region in the middle region provided by the embodiment of the present invention. FIG. 3B shows a schematic sectional structure of a guard ring trench 16 formed around the periphery of the cell array region in the middle region provided by the embodiment of the present invention. As an example, the method for forming the guard ring trench 16 around the periphery of the cell array region in the middle region may include depositing a photoresist layer on the second dielectric layer 13 and patterning the photoresist layer to form at least one first etching window in the middle region. The first dielectric layer 11, the first support layer 12 and the second dielectric layer 13 in the middle region are etched based on the first etching window until the upper surface of the substrate 10 is exposed, and at least one first guard ring trench 16 is formed around the periphery of the cell array region. As a specific example, a first guard ring trench 16 is formed at the periphery of the cell array region, and the width of the first guard ring trench is the same as that of the middle region.

Figure 4:
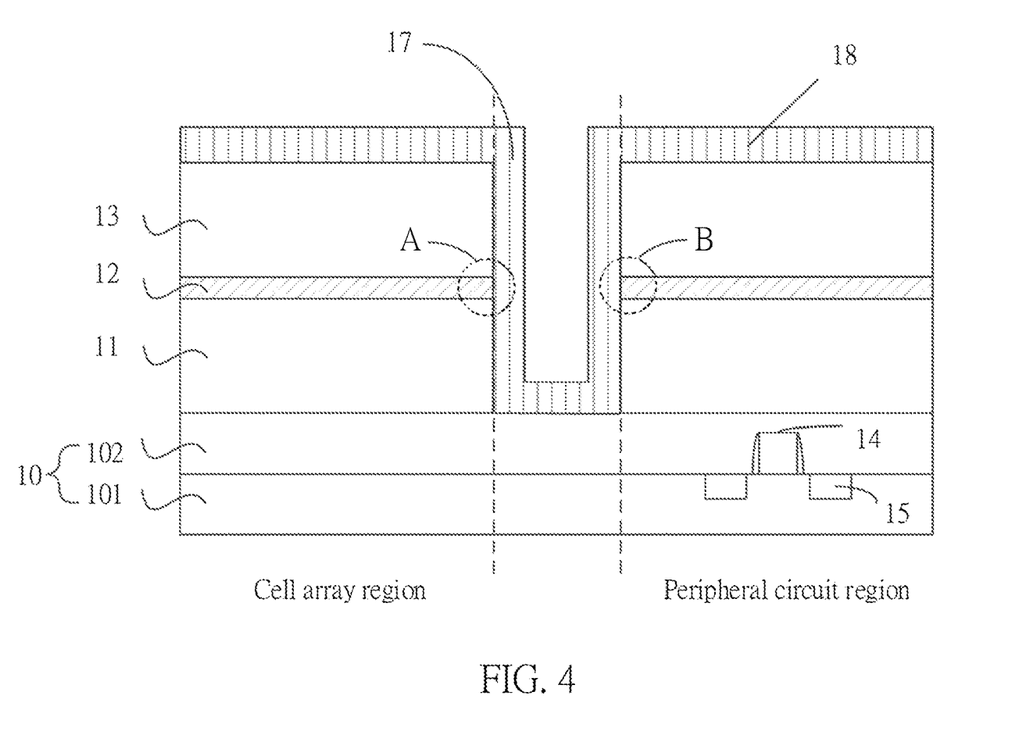
FIG. 4 shows a schematic sectional structure of forming a guard ring structure in the middle region provided by an embodiment of the present invention.

Referring to FIG. 4, FIG. 4 shows a schematic sectional structure of the guard ring structure 17 formed in the middle region provided by the embodiment of the present invention. Specifically, in step S103, a first insulating material is deposited on the upper surface of the second dielectric layer 13, and the bottom surface and sidewall of the guard ring trench 16 simultaneously, and the first insulating material is the same as the second insulating material. After the first insulating material is deposited on the bottom surface and sidewall of the guard ring trench 16, the guard ring structure 17 is formed. It should be noted that the guard ring trench 16 can be filled with the first insulating material when forming the guard ring structure 17. After depositing the first insulating material on the upper surface of the second dielectric layer 13, the second support layer 18 may be formed. In the present invention, a portion of the sidewall of the first support layer 12 directly contacts a portion of the sidewall of the second support layer 18 (for example, the circled portion A and the circled portion B shown in FIG. 4). The guard ring structure 17 at the periphery of the cell array region can physically isolate the cell array region from the peripheral circuit region to avoid current leakage. In addition, the guard ring structure 17 and the second support layer 18 of the peripheral circuit region can protect the peripheral circuit region from etching. Specifically, it can prevent the peripheral circuit region from being etched in the subsequent process of forming a capacitor structure in the cell array region, which affects the device performance of the peripheral circuit region.

Figure 5:
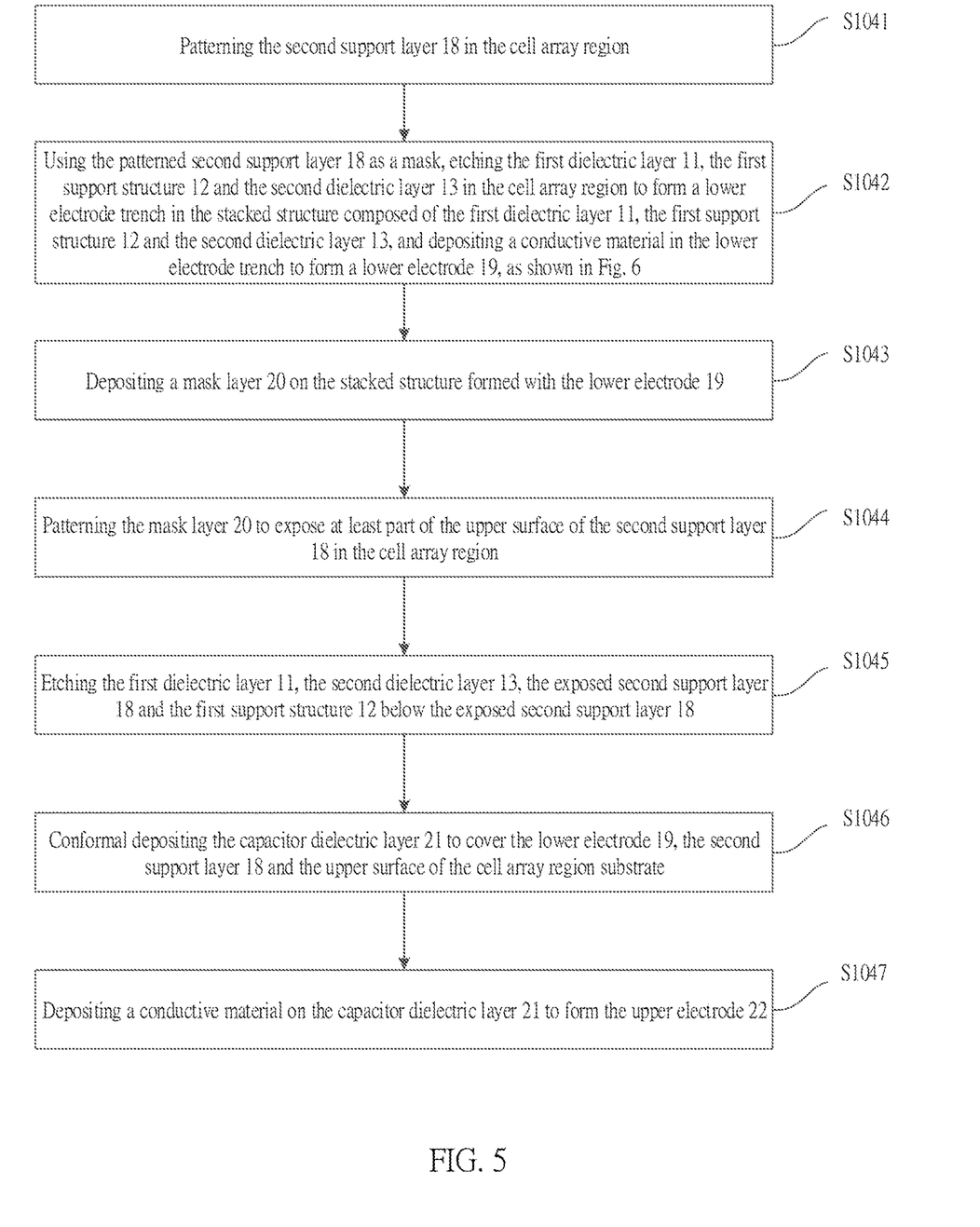
FIG. 5 shows a schematic flow chart of forming a capacitor structure in a cell array region provided by an embodiment of the present invention.

Referring to FIG. 5 to FIG. 5, FIG. 5 illustrates a flow chart of forming a capacitor structure in a cell array region provided by an embodiment of the present invention.

Specifically, step S104 may include:

S1041: Patterning the second support layer 18 in the cell array region.

Figure 6:
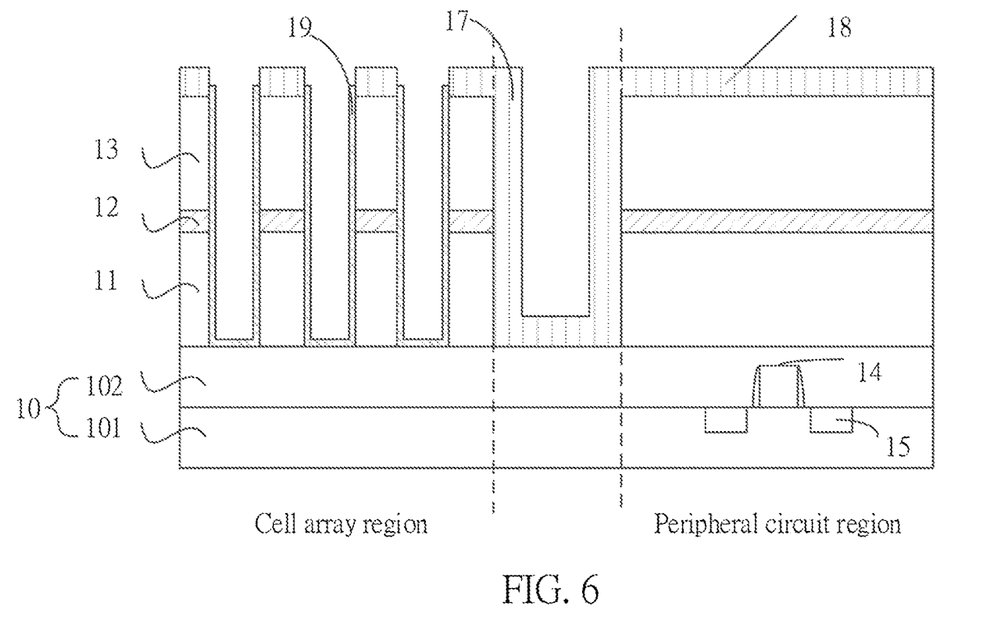
FIG. 6, FIG. 7, FIG. 8, FIG. 9, FIG. 10A, FIG. 10B, FIG. 11 and FIG. 12 show schematic cross-sectional structures corresponding to each step of forming a capacitor structure in a cell array region provided by an embodiment of the present invention.

S1042: Using the patterned second support layer 18 as a mask, etching the first dielectric layer 11, the first support layer 12 and the second dielectric layer 13 in the cell array region to form a lower electrode trench in the stacked structure composed of the first dielectric layer 11, the first support layer 12 and the second dielectric layer 13, and depositing a conductive material in the lower electrode trench to form a lower electrode 19, as shown in FIG. 6.

S1043: Depositing a mask layer 20 on the stacked structure formed with the lower electrode 19.

S1044: Patterning the mask layer 20 to expose at least part of the upper surface of the second support layer 18 in the cell array region.

S1045: Etching the first dielectric layer 11, the second dielectric layer 13, the exposed second support layer 18 and the first support layer 12 below the exposed second support layer 18.

S1046: Conformal depositing the capacitor dielectric layer 21 to cover the lower electrode 19, the second support layer 18 and the upper surface of the cell array region substrate.

S1047: Depositing a conductive material on the capacitor dielectric layer 21 to form the upper electrode 22.

The second support layer 18 may include at least one of silicon carbonitride, silicon oxycarbide, silicon carbonitride, silicon oxide, silicon nitride and silicon oxynitride.

In an embodiment of the present invention, step S1042 may specifically be to etch the first dielectric layer 11, the first support layer 12 and the second dielectric layer 13 in the cell array region by adopting a dry etching process or a wet etching process, so as to form a plurality of lower electrode trenches in a stacked structure composed of the first dielectric layer 11, the first support layer 12 and the second dielectric layer 13. A conductive material is deposited in the trench of the lower electrode by using a deposition process with better step coverage effect, such as a chemical vapor deposition process, to form the lower electrode 19. As an example, the lower electrode 19 may be formed using metal or metal nitride.

Figure 7:
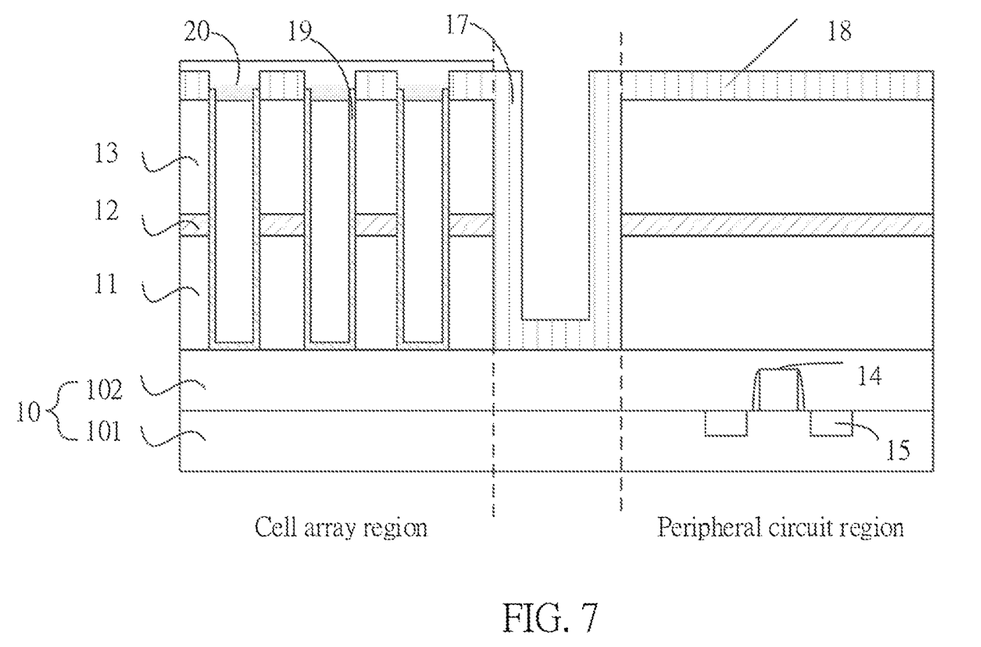

As an example, steps S1043 to S1045 may be specifically:

As shown in FIG. 7, a mask layer 20 is deposited on the stacked structure formed with the lower electrode 19. Specifically, a deposition process with can deposit the mask layer 20 on the stacked structure formed with the lower electrode, and a gap will be formed on the inner sidewall of the lower electrode.

Figure 8:
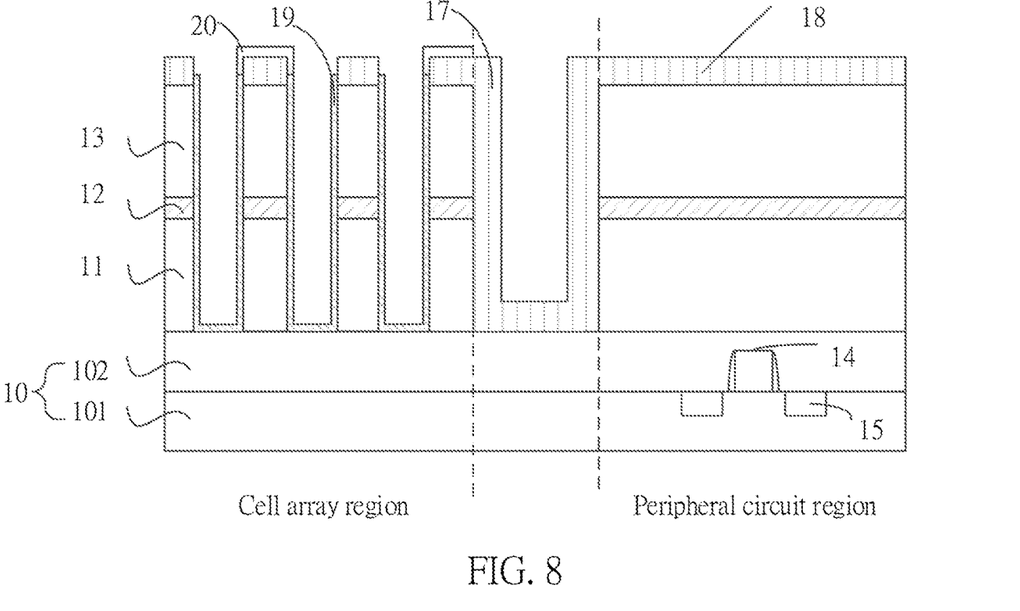

Referring to FIG. 8, the mask layer 20 is patterned to expose at least part of the upper surface of the second support layer 18 in the cell array region. As an example, patterning the mask layer 20 may specifically include depositing a photoresist layer with a target pattern on the mask layer 20, and using the photoresist layer as a mask, photo-etching and developing the mask layer 20 to form the patterned mask layer 20.

Figure 9:
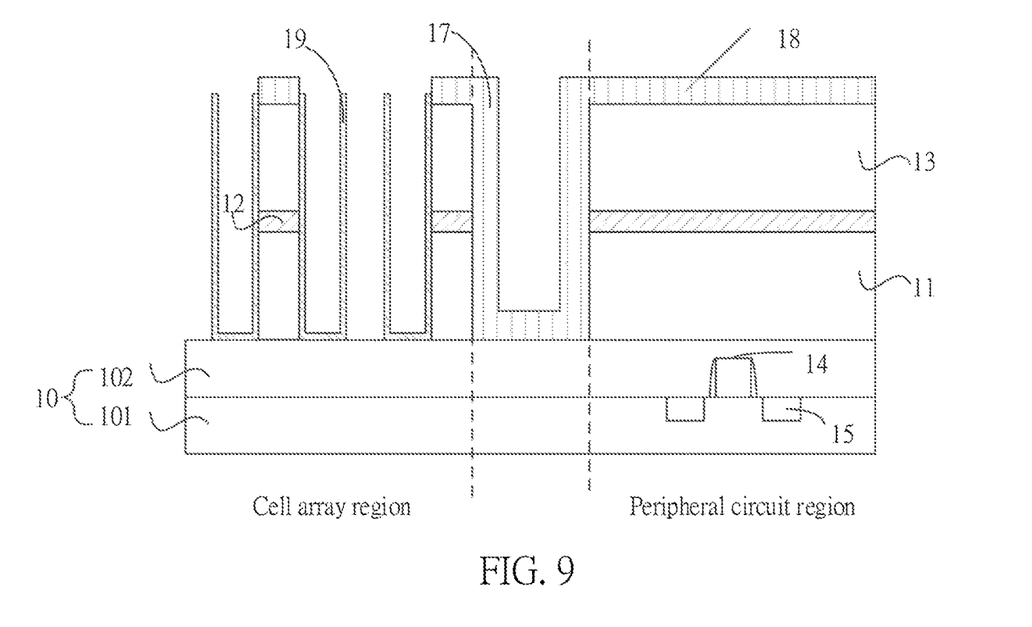

As shown in FIG. 9, the first dielectric layer 11, the second dielectric layer 13, the exposed second support layer 18 and the first support layer 12 below the exposed second support layer 18 are etched, and the mask layer 20 is removed after the etching is completed. As an example, etching the first dielectric layer 11, the second dielectric layer 13, the exposed second support layer 18 and the first support layer 12 below the exposed second support layer 18 may include etching the exposed second support layer 18 with the patterned mask layer 20 as a mask, next, a suitable etching solvent is selected to selectively etch the second dielectric layer 13 between adjacent lower electrodes 19. Afterwards, the first support layer 12 between adjacent lower electrodes 19 is etched, finally, the first dielectric layer 11 is etched.

Figure 10A:
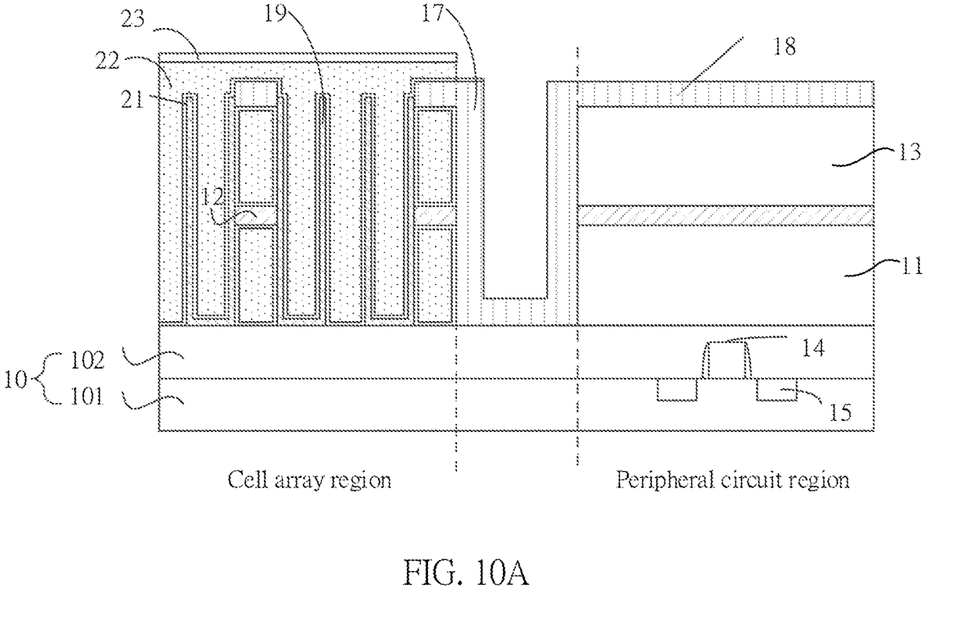
Figure 10B:
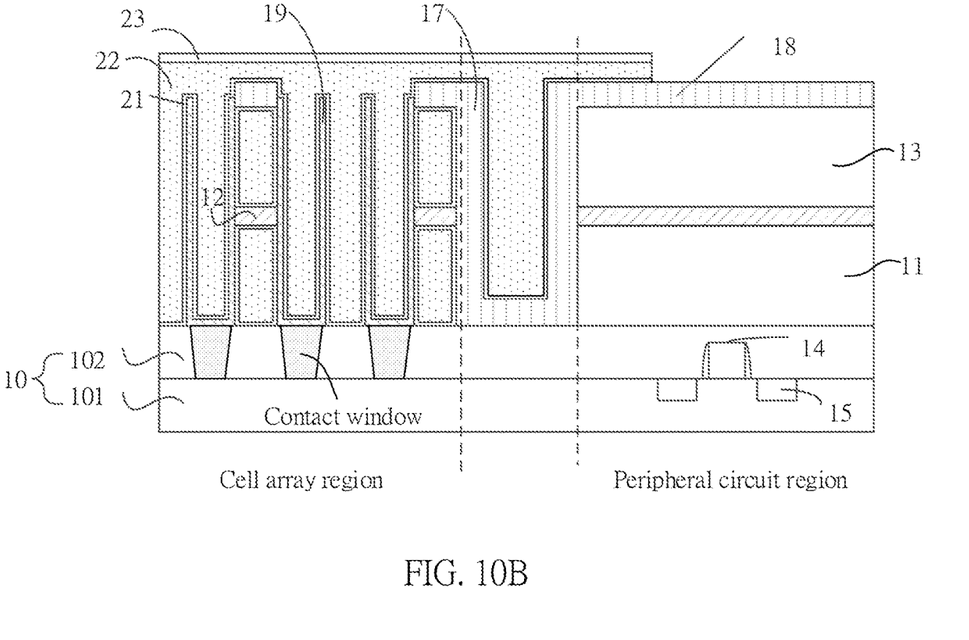

In an embodiment of the present invention, step S1046 may specifically be to deposit the capacitor dielectric layer 21 by a deposition process with better step coverage effect. As an example, as shown in FIG. 10A, the capacitor dielectric layer 21 covers the lower electrode 19, the second support layer 18 of the cell array region and the upper surface of part of the guard ring structure 17. As another example, as shown in FIG. 10B, the capacitor dielectric layer 21 conformally covers the lower electrode 19, the second support layer 18 in the cell array region, the guard ring structure 17 and the second support layer 18 in part of the peripheral circuit region. In other embodiments of the present invention, the capacitor dielectric layer 21 may also conformally cover the lower electrode 19, the guard ring structure 17 and the second support layer 18 in the cell array region and the whole peripheral circuit region. In the cell array region, a contact window may also be provided in the interlayer insulating layer 102 below the lower electrode 19. As an example, the capacitor dielectric layer 21 may include at least one of oxide, nitride or high dielectric constant material.

Further, a conductive material is deposited on the capacitor dielectric layer 21 to form an upper electrode 22. As an example, a metal layer 23 may be further deposited on the upper electrode 22, and the metal layer 23 may be tungsten. The upper electrode 22 and the metal layer 23 may partially cover the capacitor dielectric layer 21 as shown in FIG. 10A or completely cover the capacitor dielectric layer 21 as shown in FIG. 10B.

In addition to covering the capacitor dielectric layer 21, the upper electrode 22 can also fill the area between the adjacent lower electrodes 19 provided with the support structure. It should be noted that the capacitor dielectric layer 21 can also be formed on the lower surface of the second support layer 18 located in the cell array region, and the upper electrode 22 is isolated from the lower electrode 19 and the support structure by the capacitor dielectric layer 21.

Figure 11:
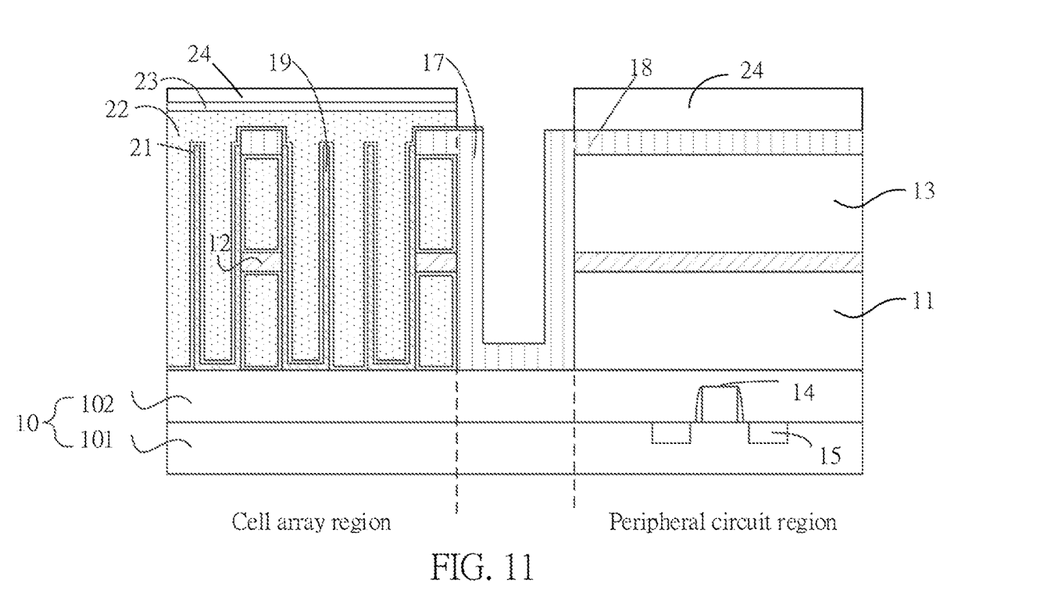

It should be noted that, in the embodiment of the present invention, in order to reduce the step height of the peripheral circuit region and the cell array region, an oxide layer 24 may be further deposited. As an example, after depositing a first insulating material on the upper surface of the second dielectric layer 13 to form the second support layer 18, it may further include depositing the oxide layer 24 on the upper surface of the second support layer 18 in the peripheral circuit region to form an ONONO structure composed of the first dielectric layer 11, the first support layer 12, the second dielectric layer 13, the second support layer 18 and the oxide layer 24, that is, an oxide-nitride-oxide-nitride-oxide structure. As shown in FIG. 11, when depositing the oxide layer 24, the oxide layer 24 can be deposited on the metal layer 23 in the cell array region and the second support layer 18 in the peripheral circuit region at the same time, so that the structural heights of the peripheral circuit region and the cell array region are equal.

Figure 12:
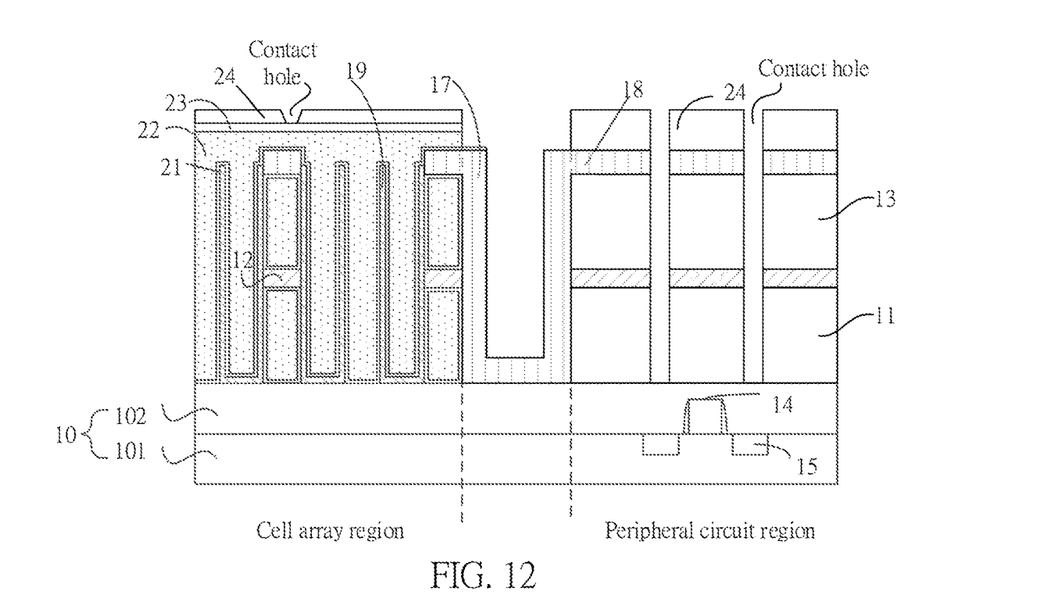

In addition, as shown in FIG. 12, the oxide layer 24 may be further etched to form contact holes exposing the metal layer 23 in the cell array region. Besides, the oxide layer 24, the second support layer 18, the second dielectric layer 13, the first support layer 12 and the first dielectric layer 11 in the peripheral circuit region may be etched to form contact holes exposing conductive contact plugs in the interlayer insulating layer 102, which are not shown in the figure.

The above is a method for manufacturing a semiconductor device provided by an embodiment of the present invention, which comprises forming a stacked structure on a substrate 10, wherein the stacked structure comprises a first dielectric layer 11, a first support layer 12 and a second dielectric layer 13 sequentially formed on the substrate, and the substrate 10 comprises a cell array region, a peripheral circuit region and an middle region between the cell array region and the peripheral circuit region. A guard ring trench 16 is formed around the periphery of the cell array region in the middle region. A first insulating material is deposited on the upper surface of the second dielectric layer 13 to form a second support layer 18, and a second insulating material is deposited on the bottom surface and sidewall of the guard ring trench 16 to form a guard ring structure 17. A capacitor structure is formed in the cell array region. In this method, the guard ring structure 17 is formed in the middle region between the cell array region and the peripheral circuit region, which can avoid etching the peripheral circuit region when the capacitor structure is formed in the cell array region, and to protect the device performance of the peripheral circuit region. In addition, it can also support the electrode structure of the cell array region, avoid the collapsing of the lower electrode 19, and improve the stability of the structure. At the same time, it can also physically isolate the cell array region from the peripheral circuit region, avoiding current leakage, thus greatly improving the performance of semiconductor devices.

The above is a semiconductor device manufacturing method provided by the present invention, in which different guard ring structures 17 can also be formed. For details, please refer to Embodiment 2:

Example 2

Embodiment 2 provided by the present invention can be further realized based on the semiconductor device manufacturing method shown in Embodiment 1, and the different execution steps from those in Embodiment 1 will be emphatically described in this embodiment.

Figure 13:
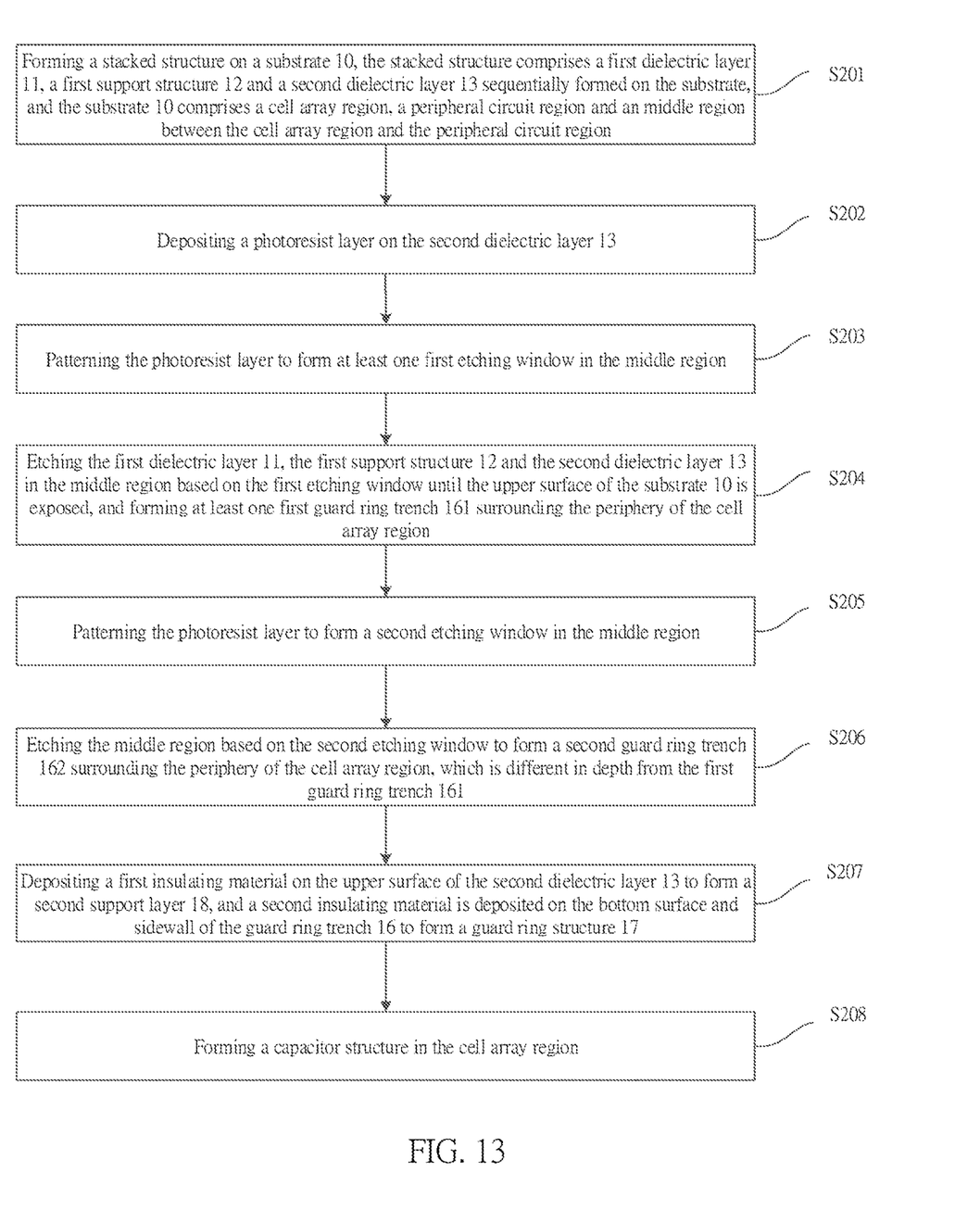
FIG. 13 shows a schematic flow chart of a semiconductor device manufacturing method provided by an embodiment of the present invention.

Referring to FIG. 13, FIG. 13 shows a schematic flow chart of a semiconductor device manufacturing method provided by an embodiment of the present invention, which includes:

S201: Forming a stacked structure on a substrate 10, the stacked structure comprises a first dielectric layer 11, a first support layer 12 and a second dielectric layer 13 sequentially formed on the substrate, and the substrate 10 comprises a cell array region, a peripheral circuit region and an middle region between the cell array region and the peripheral circuit region.

S202: Depositing a photoresist layer on the second dielectric layer 13.

S203: Patterning the photoresist layer to form at least one first etching window in the middle region.

S204: Etching the first dielectric layer 11, the first support layer 12 and the second dielectric layer 13 in the middle region based on the first etching window until the upper surface of the substrate 10 is exposed, and forming at least one first guard ring trench 161 surrounding the periphery of the cell array region.

S205: Patterning the photoresist layer to form a second etching window in the middle region.

S206: Etching the middle region based on the second etching window to form a second guard ring trench 162 surrounding the periphery of the cell array region, which is different in depth from the first guard ring trench 161.

S207: Depositing a first insulating material on the upper surface of the second dielectric layer 13 to form a second support layer 18, and a second insulating material is deposited on the bottom surface and sidewall of the guard ring trench 16 to form a guard ring structure 17.

S208: Forming a capacitor structure in the cell array region.

Among them, step S201, step S207, and step S208 may be the same as step S101, step S103, and step S104 in the first embodiment, and will not be repeated here for brevity.

In an embodiment of the present invention, steps S203-S204 may be performed before steps S205-S206, steps S203 and S205 may be performed at the same time and then steps S204 and S206 may be performed respectively, or steps S205-S206 may be performed before steps S203-S204. In an embodiment of the present invention, the performing order of steps S203-S204 and S205-S206 is not particularly limited.

In step S204, at least one first guard ring trench 161 is formed around the periphery of the cell array region, as shown in FIG. 3A.

Figure 14:
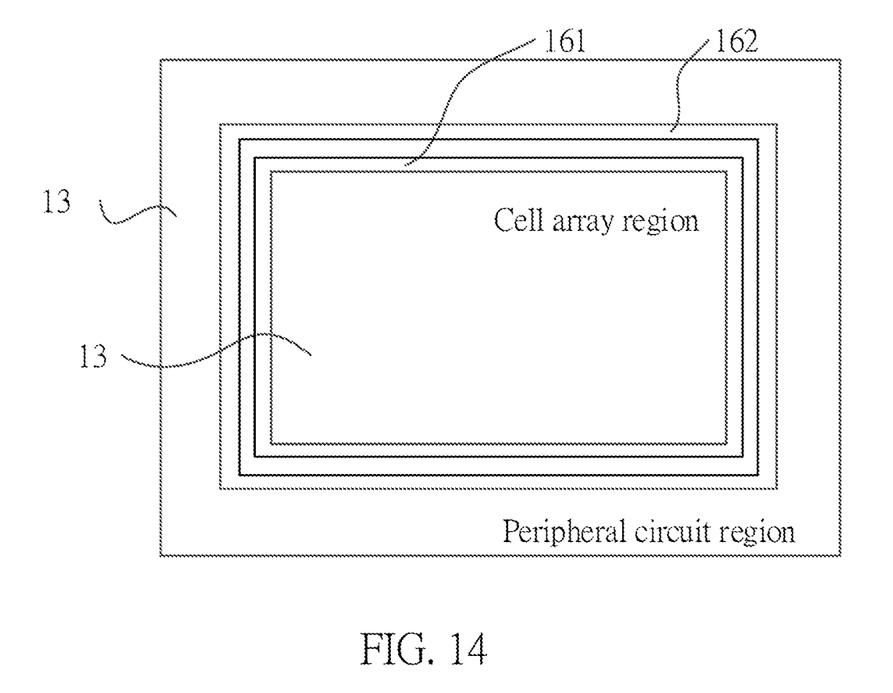
FIG. 14 shows a schematic sectional structure of forming a second guard ring trench provided by an embodiment of the present invention.

Referring to FIG. 14, FIG. 14 shows a schematic sectional structure of etching the middle region based on the second etching window to form a second guard ring trench 162 around the periphery of the cell array region. The depth of the second guard ring trench 162 is different from that of the first guard ring trench 161. It should be noted that the second guard ring trench 162 may be located at the periphery of the first guard ring trench 161 or the first guard ring trench 161 may be located at the periphery of the second guard ring trench 162. As another example, forming the second guard ring trench 162 around the periphery of the cell array region may include forming a plurality of second guard ring trenches 162 around the periphery of the cell array region, the second guard ring trenches 162 extend at different depths along the direction perpendicular to the substrate. By providing at least one first guard ring trench 161 and a second guard ring trench 162 with different depths, the physical isolation effect between the cell array region and the peripheral circuit region can be further improved on the basis of supporting the cell array region structure, and current leakage can be avoided.

The above is a semiconductor device manufacturing method provided by another embodiment of the present invention. By patterning the photoresist layer, at least one first etching window can be formed in the middle region, and the first guard ring trench 161 surrounding the periphery of the cell array region can be formed based on the first etching window, and a second guard ring trench 162 surrounding the periphery of the cell array region can be formed based on the second etching window, the second guard ring trench 162 is different in depth from the first guard ring trench 161. The method can achieve the same beneficial effects as the first embodiment, and by forming at least one first guard ring trench 161 and a second guard ring trench 162 with different depths in the middle region between the cell array region and the peripheral circuit region, the physical isolation effect between the cell array region and the peripheral circuit region can be further improved, and current leakage can be avoided, thereby greatly improving the performance of the semiconductor device.

In some embodiments of the present invention, a semiconductor device is provided, the semiconductor device includes a substrate, a stacked structure disposed on the substrate, the substrate comprises a cell array region, a peripheral circuit region and a middle region between the cell array region and the peripheral circuit region, the stacked structure comprises a first support layer, a first trench located in the middle region, a second support layer located on an upper surface of the stacked structure, wherein parts of the second support layer is disposed in the first trench, wherein a portion of a sidewall of the first support layer directly contacts a portion of a sidewall of the second support layer, and a capacitor structure located in the cell array region.

In some embodiments of the present invention, a second trench structure is disposed between the first trench structure and the peripheral circuit region.

In some embodiments of the present invention, part of the second support layer is disposed in the first trench to form first guard ring structure in the middle region.

In some embodiments of the present invention, parts of the second support layer is disposed in the second trench to form second guard ring structure in the middle region, wherein the second guard ring structure surrounds the first guard ring structure.

In some embodiments of the present invention, the semiconductor device further comprises an ONONO structure located on the substrate of the peripheral circuit region, and the ONONO structure comprises a first dielectric layer, the first support layer, a second dielectric layer, the second support layer and an oxide layer.

In some embodiments of the present invention, the capacitor structure comprises a lower electrode, a capacitor dielectric layer and an upper electrode.

In some embodiments of the present invention, wherein both the first support layer and the second support layer contact the capacitor structure directly in the cell array region.

In some embodiments of the present invention, part of the second support layer disposed in the first trench directly contacts the capacitor structure.

In some embodiments of the present invention, the second support layer disposed on the upper surface of the stacked structure and the second support layer disposed in the first trench are an integrally formed structure.

In some embodiments of the present invention, the second support layer disposed in the cell array region, in the peripheral circuit region and in the middle region.

In some embodiments of the present invention, a method of forming a semiconductor device is provided, the method includes forming a substrate, forming a stacked structure on the substrate, wherein the substrate comprises a cell array region, a peripheral circuit region and an middle region between the cell array region and the peripheral circuit region, the stacked structure comprises a first support layer, forming a first trench in the middle region, forming a second support layer located on an upper surface of the stacked structure, wherein parts of the second support layer is disposed in the first trench, wherein a portion of a sidewall of the first support layer directly contacts a portion of a sidewall of the second support layer, and forming a capacitor structure in the cell array region.

In some embodiments of the present invention, a second trench structure is further formed between the first trench structure and the peripheral circuit region.

In some embodiments of the present invention, part of the second support layer is disposed in the first trench to form first guard ring structure in the middle region.

In some embodiments of the present invention, parts of the second support layer is disposed in the second trench to form second guard ring structure in the middle region, wherein the second guard ring structure surrounds the first guard ring structure.

In some embodiments of the present invention, the semiconductor device further comprises an ONONO structure located on the substrate of the peripheral circuit region, and the ONONO structure comprises a first dielectric layer, the first support layer, a second dielectric layer, the second support layer and an oxide layer.

In some embodiments of the present invention, the capacitor structure comprises a lower electrode, a capacitor dielectric layer and an upper electrode.

In some embodiments of the present invention, both the first support layer and the second support layer contact the capacitor structure directly.

In some embodiments of the present invention, part of the second support layer disposed in the first trench directly contacts the capacitor structure.

In some embodiments of the present invention, the second support layer disposed on the upper surface of the stacked structure and the second support layer disposed in the first trench are an integrally formed structure.

In some embodiments of the present invention, the second support layer disposed in the cell array region, in the peripheral circuit region and in the middle region simultaneously.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate;
a stacked structure disposed on the substrate, the substrate comprises a cell array region, a peripheral circuit region and a middle region between the cell array region and the peripheral circuit region, wherein the stacked structure comprises a first support layer;
a first trench located in the middle region;
a second support layer located on an upper surface of the stacked structure, wherein parts of the second support layer is disposed in the first trench, and wherein a portion of a sidewall of the first support layer directly contacts a portion of a sidewall of the second support layer; and
a capacitor structure located in the cell array region, wherein both the first support layer and the second support layer contact the capacitor structure directly in the cell array region.

2. The semiconductor device of claim 1, further comprising a second trench structure disposed between the first trench structure and the peripheral circuit region.

3. The semiconductor device of claim 2, wherein parts of the second support layer is disposed in the second trench to form second guard ring structure in the middle region, wherein the second guard ring structure surrounds the first guard ring structure.

4. The semiconductor device of claim 1, wherein parts of the second support layer is disposed in the first trench to form first guard ring structure in the middle region.

5. The semiconductor device of claim 1, wherein the semiconductor device further comprises an ONONO structure located on the substrate of the peripheral circuit region, and the ONONO structure comprises a first dielectric layer, the first support layer, a second dielectric layer, the second support layer and an oxide layer.

6. The semiconductor device of claim 1, wherein the capacitor structure comprises a lower electrode, a capacitor dielectric layer and an upper electrode.

7. The semiconductor device of claim 1, wherein parts of the second support layer disposed in the first trench directly contacts the capacitor structure.

8. The semiconductor device of claim 1, wherein the second support layer disposed on the upper surface of the stacked structure and the second support layer disposed in the first trench are an integrally formed structure.

9. The semiconductor device of claim 1, wherein the second support layer disposed in the cell array region, in the peripheral circuit region and in the middle region.

10. A method of forming a semiconductor device, comprising:
    forming a substrate;
    forming a stacked structure on the substrate, wherein the substrate comprises a cell array region, a peripheral circuit region and an middle region between the cell array region and the peripheral circuit region, wherein the stacked structure comprises a first support layer;
    forming a first trench in the middle region;
    forming a second support layer located on an upper surface of the stacked structure, wherein parts of the second support layer is disposed in the first trench, and wherein a portion of a sidewall of the first support layer directly contacts a portion of a sidewall of the second support layer; and
    forming a capacitor structure in the cell array region, wherein both the first support layer and the second support layer contact the capacitor structure directly in the cell array region.

11. The method of claim 10, further comprising forming a second trench structure between the first trench structure and the peripheral circuit region.

12. The method of claim 11, wherein parts of the second support layer is disposed in the second trench to form second guard ring structure in the middle region, wherein the second guard ring structure surrounds the first guard ring structure.

13. The method of claim 10, wherein parts of the second support layer is disposed in the first trench to form first guard ring structure in the middle region.

14. The method of claim 10, wherein the semiconductor device further comprises an ONONO structure located on the substrate of the peripheral circuit region, and the ONONO structure comprises a first dielectric layer, the first support layer, a second dielectric layer, the second support layer and an oxide layer.

15. The method of claim 10, wherein the capacitor structure comprises a lower electrode, a capacitor dielectric layer and an upper electrode.

16. The method of claim 10, wherein parts of the second support layer disposed in the first trench directly contacts the capacitor structure.

17. The method of claim 10, wherein the second support layer disposed on the upper surface of the stacked structure and the second support layer disposed in the first trench are an integrally formed structure.

18. The method of claim 10, wherein the second support layer disposed in the cell array region, in the peripheral circuit region and in the middle region simultaneously.

* * * * *